(12) United States Patent
Zipf et al.

(10) Patent No.: US 11,979,073 B2
(45) Date of Patent: May 7, 2024

(54) FOUR-WHEEL DRIVE HUB LOCK HARNESS ASSEMBLY

(71) Applicant: Prettl Electric Corp., Greenville, SC (US)

(72) Inventors: Christoph Zipf, Greenville, SC (US); Lukas Graf, Greenville, SC (US)

(73) Assignee: FIT VOLTAIRA AMERICAS CORPORATION, Greenville, SC (US)

( * ) Notice: Subject to any disclaimer, the term of this patent is extended or adjusted under 35 U.S.C. 154(b) by 637 days.

(21) Appl. No.: 17/165,414

(22) Filed: Feb. 2, 2021

(65) Prior Publication Data

US 2022/0247252 A1 Aug. 4, 2022

(51) Int. Cl.
| | |
|---|---|
| *H05K 5/04* | (2006.01) |
| *B60R 16/02* | (2006.01) |
| *G01D 5/14* | (2006.01) |
| *H02K 5/04* | (2006.01) |
| *H02K 11/215* | (2016.01) |
| *H05K 7/14* | (2006.01) |

(52) U.S. Cl.
CPC ............ *H02K 5/04* (2013.01); *B60R 16/0215* (2013.01); *G01D 5/145* (2013.01); *H02K 11/215* (2016.01); *H05K 7/1427* (2013.01)

(58) Field of Classification Search
CPC ................................ H02K 5/04; H05K 7/1427
USPC .......................................................... 361/826
See application file for complete search history.

(56) References Cited

U.S. PATENT DOCUMENTS

| 7,316,304 | B2 | 1/2008 | Heravi et al. | |
|---|---|---|---|---|
| 7,793,767 | B2 | 9/2010 | Heravi et al. | |
| 9,205,738 | B2 | 12/2015 | Clohessy et al. | |
| 2008/0203835 | A1* | 8/2008 | Torres | E05F 15/697 310/68 R |
| 2015/0300418 | A1* | 10/2015 | Averill | B60K 17/344 192/20 |
| 2017/0127975 | A1* | 5/2017 | Bozkurt | A01K 29/005 |
| 2020/0026020 | A1* | 1/2020 | Dowd | G02B 6/4488 |
| 2021/0020824 | A1* | 1/2021 | Bodnar | H10N 30/00 |

* cited by examiner

*Primary Examiner* — Hung S. Bui
(74) *Attorney, Agent, or Firm* — Jeffrey H. Kamenetsky; Burr & Forman LLP

(57) ABSTRACT

A four-wheel drive hub lock harness assembly is disclosed. The harness assembly comprises a motor receptacle configured to retain a motor. The motor receptacle comprises a retainer and lead frame assembly configured to house a printed circuit board, a magnetic sensor electrically coupled to the retainer and lead frame assembly, a first and second bracket extending substantially vertically from the retainer and lead frame assembly, the first and second brackets configured to secure corresponding ends of the motor to the retainer and lead frame assembly, and encapsulation material encapsulating the printed circuit board and magnetic sensor for dampening vibrations of the wheels of a vehicle. The harness assembly also comprises a housing assembly situated beneath the motor receptacle, which mechanically connects with the eIWE, and a cable extending from the housing assembly, the cable configured to electrically connect the hub lock harness assembly to a powertrain control module (PCM).

5 Claims, 11 Drawing Sheets

FOUR-WHEEL DRIVE HUB LOCK HARNESS ASSEMBLY

TECHNICAL FIELD

This disclosure relates to mechanisms for four-wheel drive vehicles, and more specifically to a drive hub lock harness assembly that is electrically connected to an electric integrated wheel end disconnect, the hub lock harness assembly including a variety of features for improving the performance of the electric integrated wheel end disconnect during shifting between two-wheel drive and four-wheel drive.

BACKGROUND

Locking hubs are fitted into some four-wheel drive vehicles, allowing the front wheels to rotate freely when disconnected from the front axle. This is done to reduce the mechanical resistance of the front-portion of the drivetrain when four-wheel drive is not in use. When in four-wheel drive, the hub and wheel lock onto the axle to be powered by the drivetrain. Or, when four-wheel drive is not needed, the hub can unlock from the axle thereby allowing the front wheels to rotate freely within the hub.

On many vehicles, such as 4×4 trucks, automatic locking hubs are used to disengage the front wheels when four-wheel drive is not needed. An advantage of being able to disengage the front wheels automatically is that the driver doesn't have get out of his vehicle and activate a dial on the hub to disengage or engage the front wheels. The automatic locking hub does this automatically.

One type of mechanism that is used to assist in the shifting to four-wheel drive is an integrated wheel end ("IWE") disconnect system, such as a vacuum IWE. In a vacuum IWE, a vacuum is placed on the system to unlock the hubs while the vehicle is in motion. When shifting to four-wheel drive, the vacuum is released, thus locking the hubs. However, a vacuum leak at any part of the system can cause failure. A leak can occur, for example, when the internal diaphragm wears out from regular use, or cracks from lack of use, or is not properly lubricated. Grinding may occur when the splined actuator doesn't have the vacuum it needs to fully engage the axle shaft. Eventually the vacuum leak expands, and the system is unable to operate. Thus, any truck manufacturers are switching from vacuum IWEs to electric IWEs.

Electric IWEs ("eIWS") use wave gears to translate a clutch ring driven by a low power electric gear train to disconnect and connect four-wheel drive. This results in faster shifting speed when disconnecting from four-wheel drive, higher durability, and eliminates the need for the older style vacuum system.

SUMMARY

In one aspect of the present disclosure, a four-wheel drive hub lock harness assembly is provided. The hub lock harness includes a motor receptacle configured to retain a motor, the motor receptacle including a retainer and lead frame assembly configured to house a printed circuit board, a magnetic sensor electrically coupled to the retainer and lead frame assembly, a first and second bracket extending substantially vertically from the retainer and lead frame assembly, the first and second brackets configured to secure corresponding ends of the motor to the retainer and lead frame assembly, and encapsulation material encapsulating the printed circuit board and magnetic sensor for dampening vibrations of the wheels of a vehicle. The hub lock harness also include a housing assembly situated beneath the motor receptacle, and a cable extending from the housing assembly, the cable configured to electrically connect the hub lock harness assembly to a powertrain control module (PCM).

In another embodiment of this aspect, the housing further comprises at least one silicon seal to prevent media from entering the housing. In another embodiment, an interior of the cable includes an adhesive material to minimize the amount of media entering the cable. In another embodiment, the encapsulation material is Technomelt®. In another embodiment, the magnetic sensor is a hall-effect integrated circuit. In another embodiment, the magnetic sensor is electrically coupled to the retainer and lead assembly via an IC lead, and a single wire is directly weld compacted to the IC lead.

DETAILED DESCRIPTION OF EXEMPLARY EMBODIMENTS

The present disclosure provides a hub lock harness assembly that transfers electrical power and signals to a PCB and motor which is integrated with an electric integrated wheel end disconnect (eIWE), for use in four-wheel drive vehicles. The hub lock harness assembly includes several features that improve the performance of the eIWE and eliminate such issues as excess vibration during driving, which can harm internal components in the hub lock harness assembly like PCBs and magnetic sensors, water and air (i.e., "media") entering wires and cables, and the electric motor in the hub lock harness assembly from being dislodged during transport.

Figure 1:
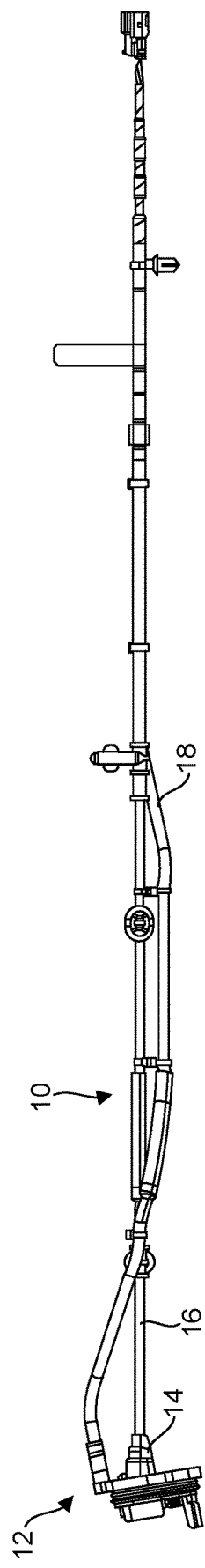
FIG. 1 is a side view of the hub lock harness of the present disclosure.

FIG. 1 shows a side view of the hub lock harness assembly 10 of the present disclosure. Hub lock harness assembly 10 includes a motor receptacle 12 in which a motor is secured. The securing of the motor within the motor receptacle 12, particularly during transport of the hub lock harness assembly 10, will be explained in further detail below. Hub lock harness assembly 10 also includes a housing assembly 14 situated beneath the motor receptacle 12, a retainer and lead frame assembly 22 (not shown in FIG. 1), an elongated harness cable 16 and an elongated vent hose assembly 18. The motor receptacle 12 of hub lock harness assembly 10 is configured for insertion within the housing of an eIWE. This will provide a mechanical connection between hub lock harness assembly 10 and the eIWE.

Figure 2:
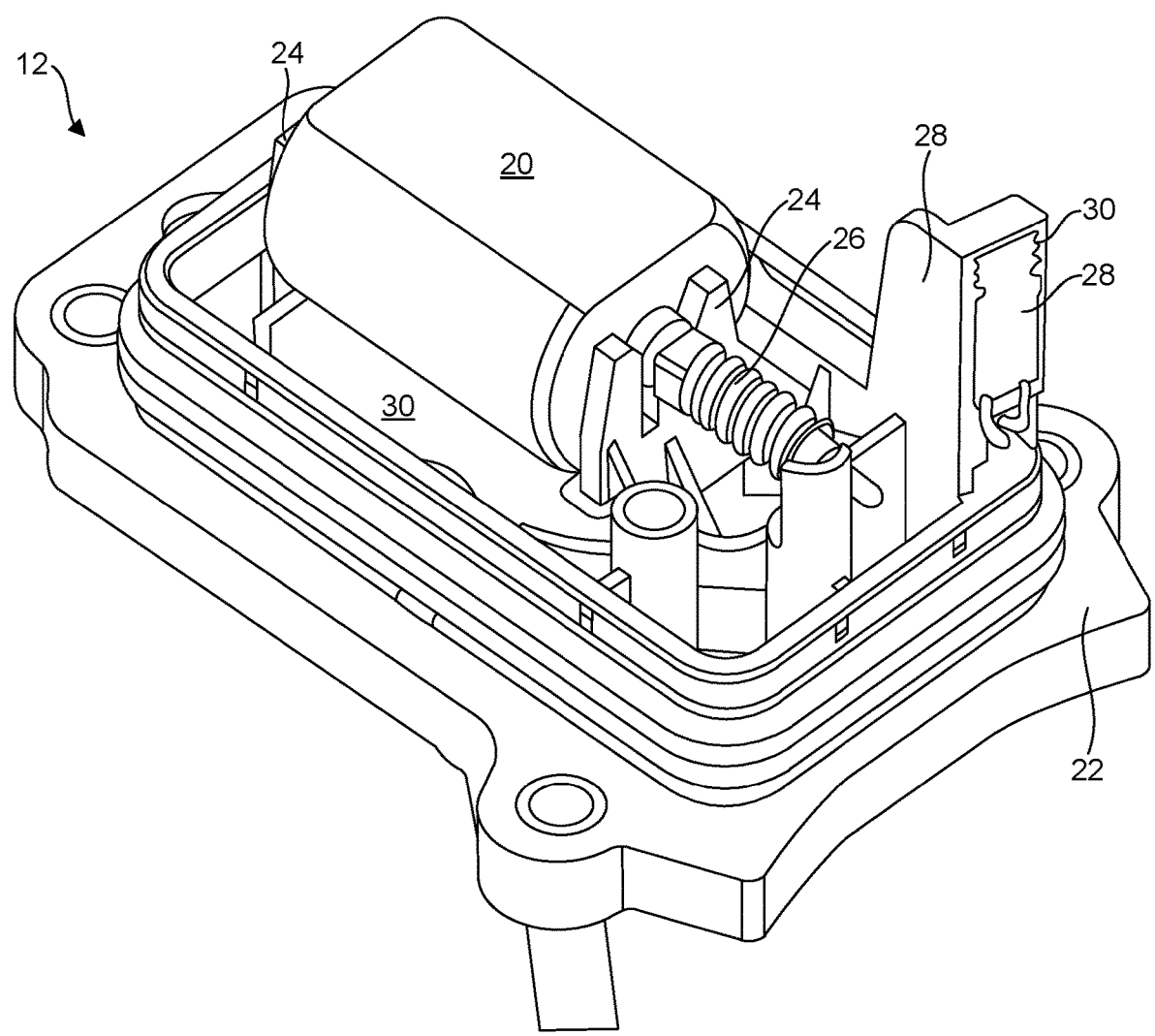
FIG. 2 is a cut-away view of the motor receptacle of the hub lock harness of the present disclosure.

FIG. 2 shows a close-up, perspective view of motor receptacle 12 and retainer and lead frame assembly 22. Motor 20 can be seen secured in motor receptacle 12 via motor retention brackets 24. Brackets 24 are situated on each side of motor 20 and are configured to secure motor 20 within motor receptacle 12. This is particularly advantageous during transport of hub lock harness assembly 10 in order to prevent motor 20 from being dislodged. In one embodiment, brackets 24 include an undercut feature that is configured to retain motor 20 on its bearing extrusion. Thus, motor 20 can essentially be "snapped" down onto brackets 24 and thus safely secured within motor receptacle 20.

FIG. 2 also shows worm gear 26 extending from one end of motor 20, and a magnetic sensor 28 extending vertically from motor receptacle 12. In one embodiment, magnetic sensor 28 is a Hall integrated circuit ("Hall IC"). Retainer and lead frame assembly 22 reside within motor receptacle 12. At least one printed circuit board (PCB") (not shown in FIG. 2) resides within retainer and lead frame assembly 22. In one embodiment, in order to dampen the severe vibrations that can occur to retainer and lead frame assembly 22 and the PCB when the vehicle is in motion, encapsulation material 30 is used to embed the PCB within the retainer and lead frame assembly 22. Examples of encapsulation material 30 are, for example, a hotmelt adhesive such as Technomelt®. In another embodiment, encapsulation material 30 is also used to embed and dampen the vibrations imparted on magnetic sensor 28.

Figure 3:
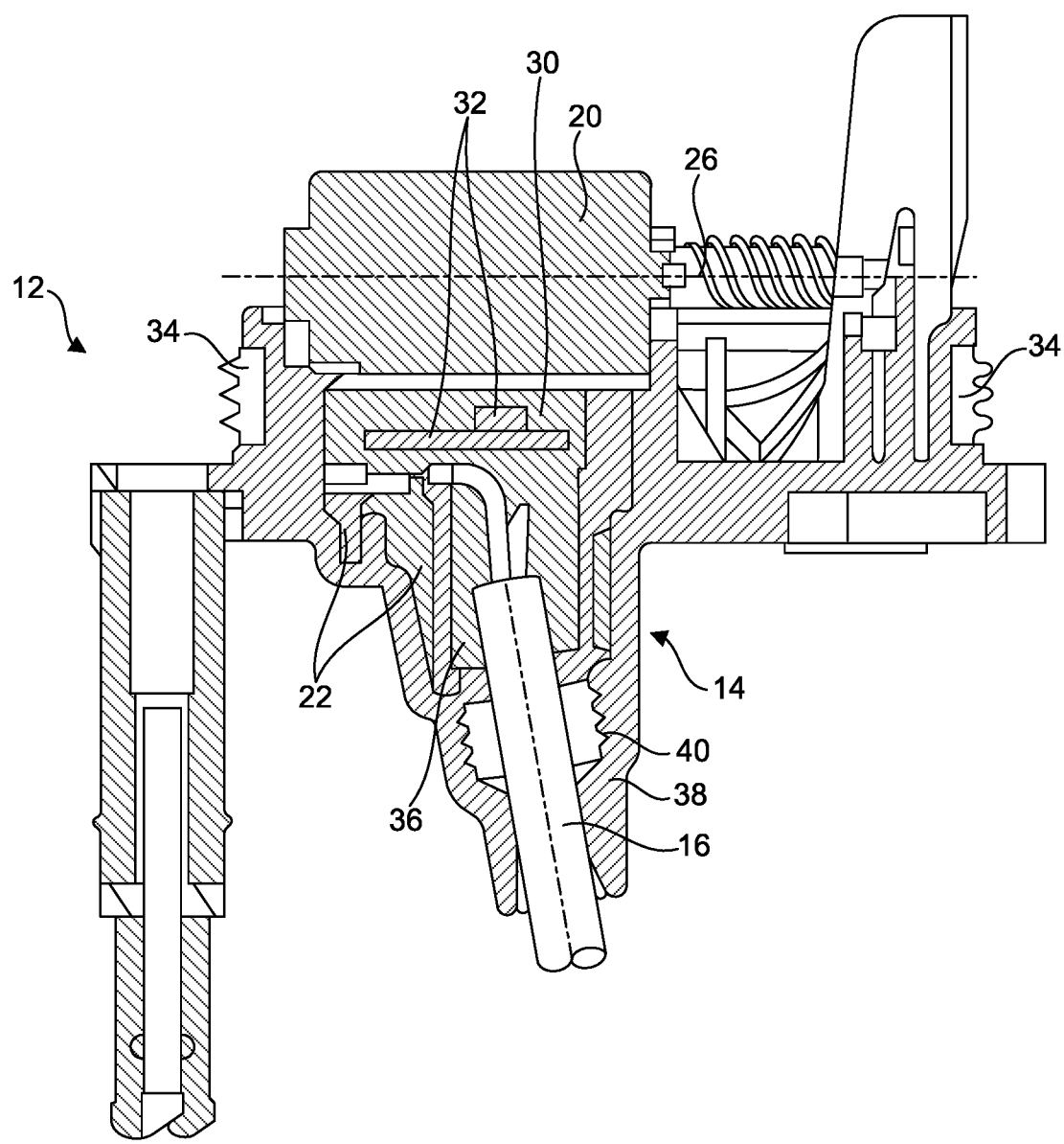
FIG. 3 is a cross-sectional side view of the motor receptacle and motor receptacle housing of the hub lock harness of the present disclosure.

FIG. 3 is a cut-away side view of motor receptacle 12, retainer and lead frame assembly 22, and housing assembly 14. Here, it can be seen that PCB 32 is embedded within encapsulation material 30 as explained above. To address the issue of media seeping within motor receptacle 12 and housing assembly 14, the hub lock harness assembly 10 of the present disclosure includes one or more seals, i.e., seal 34 and cable seal 40 (two seals 34 and 40 are shown in FIG. 3, but the present disclosure is not limited to only two seals but may include one or more seals). Seal 34 could be, in one embodiment, a custom silicon seal, and is situated within motor receptacle 12 to limit or eliminate water from seeping in to motor receptacle 12 and potentially damaging components within receptacle 12 and retainer and lead assembly 22, such as, for example, PCB 32. Cable seal 40, as shown, is also capable of limiting or eliminating media from seeping into motor receptacle 12 and potentially damaging components therein. As shown in FIG. 3, housing assembly 14 also includes components such as clamp 36, and motor receptacle cover 38.

Figure 4:
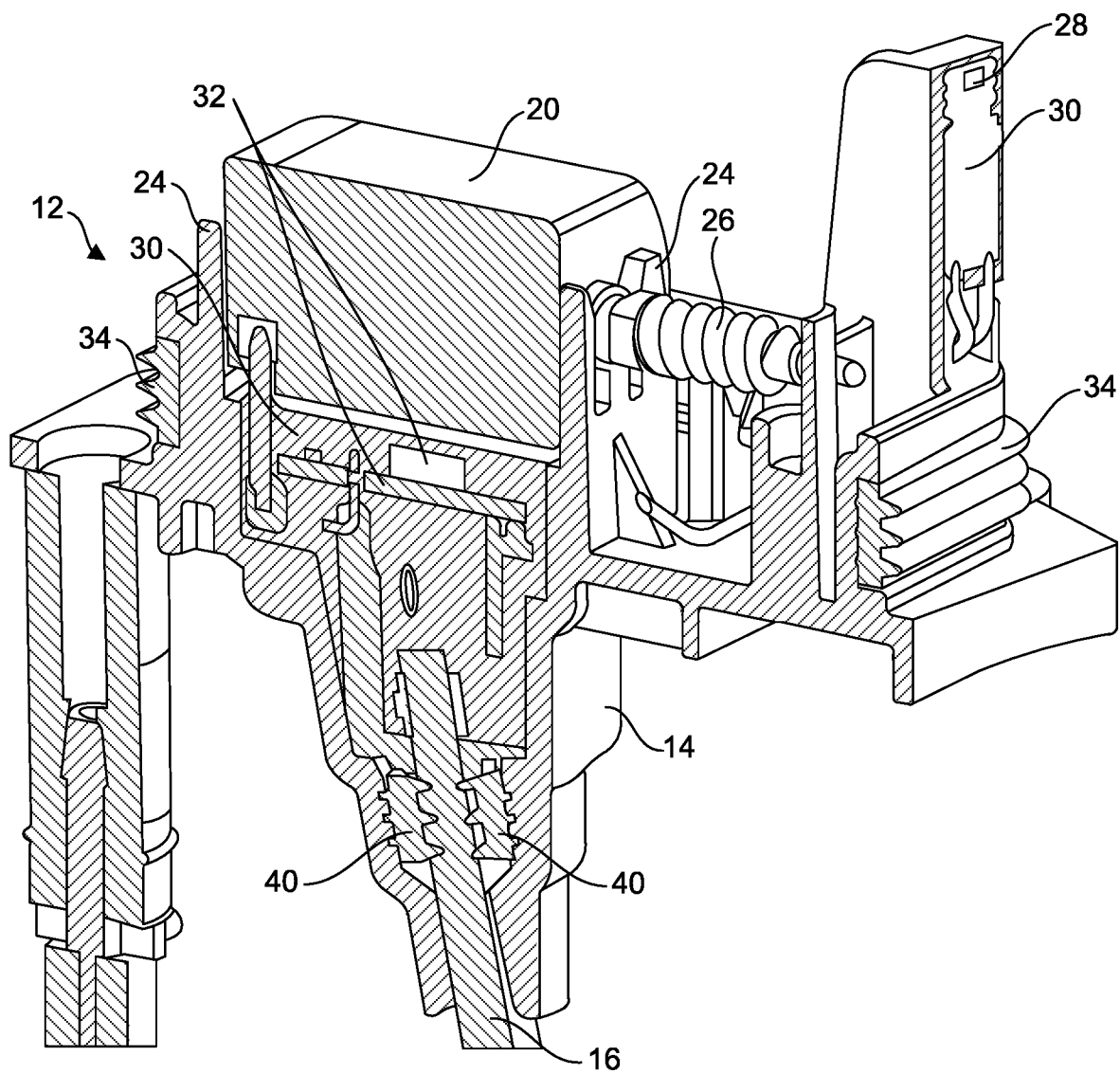
FIG. 4 is a cross-sectional perspective view of the motor receptacle and motor receptacle housing of the hub lock harness of the present disclosure.

FIG. 4 is a cut-away perspective view of motor receptacle 12, retainer and lead frame assembly 22, and housing assembly 14. Many of the components shown in FIG. 3 are shown in FIG. 4. In addition, FIG. 4 shows magnetic sensor 28 embedded in encapsulation material 30, as discussed above.

Figure 5:
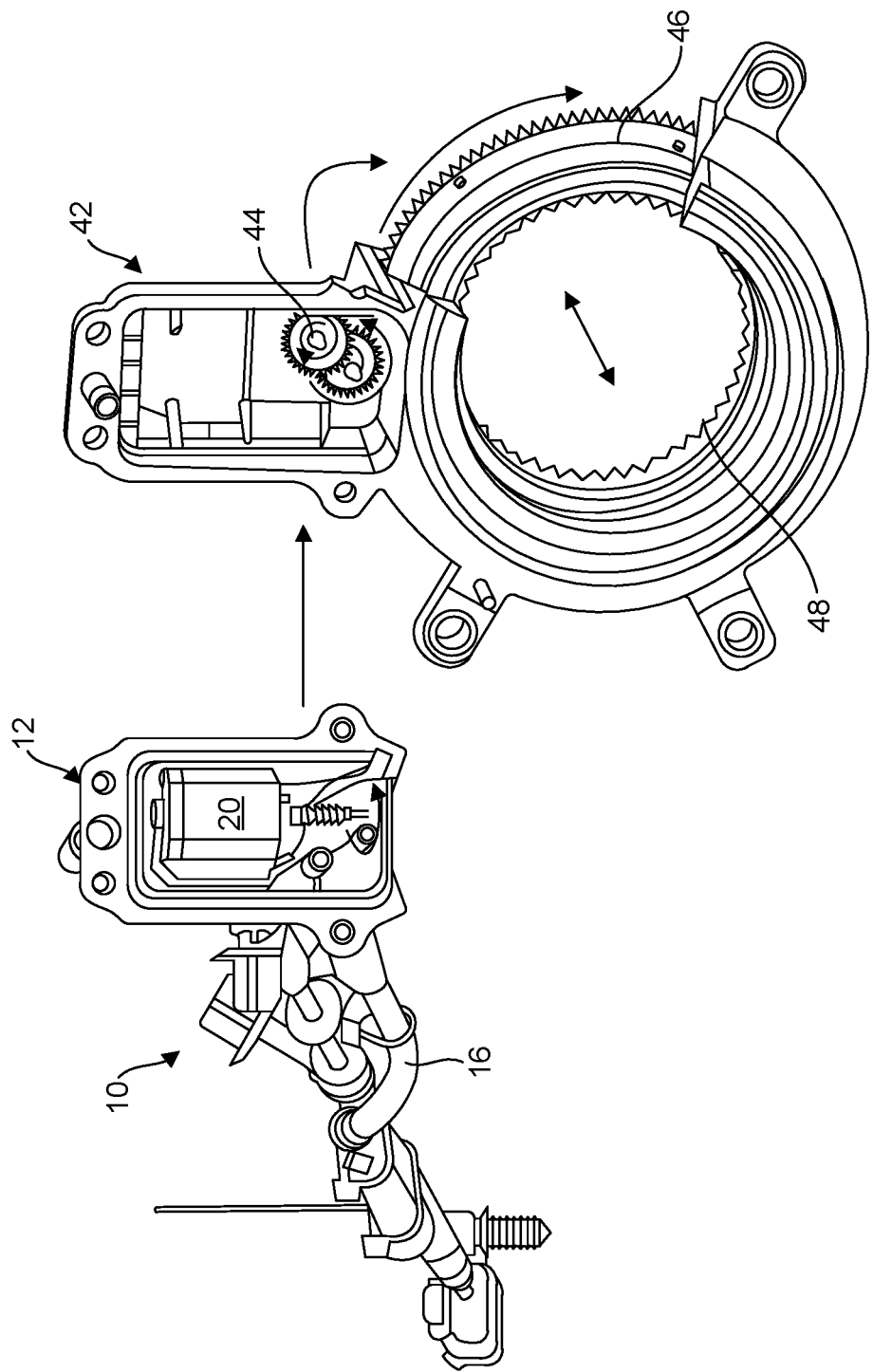
FIG. 5 is a perspective view of the hub lock harness before insertion within the eIWE housing.
Figure 6:
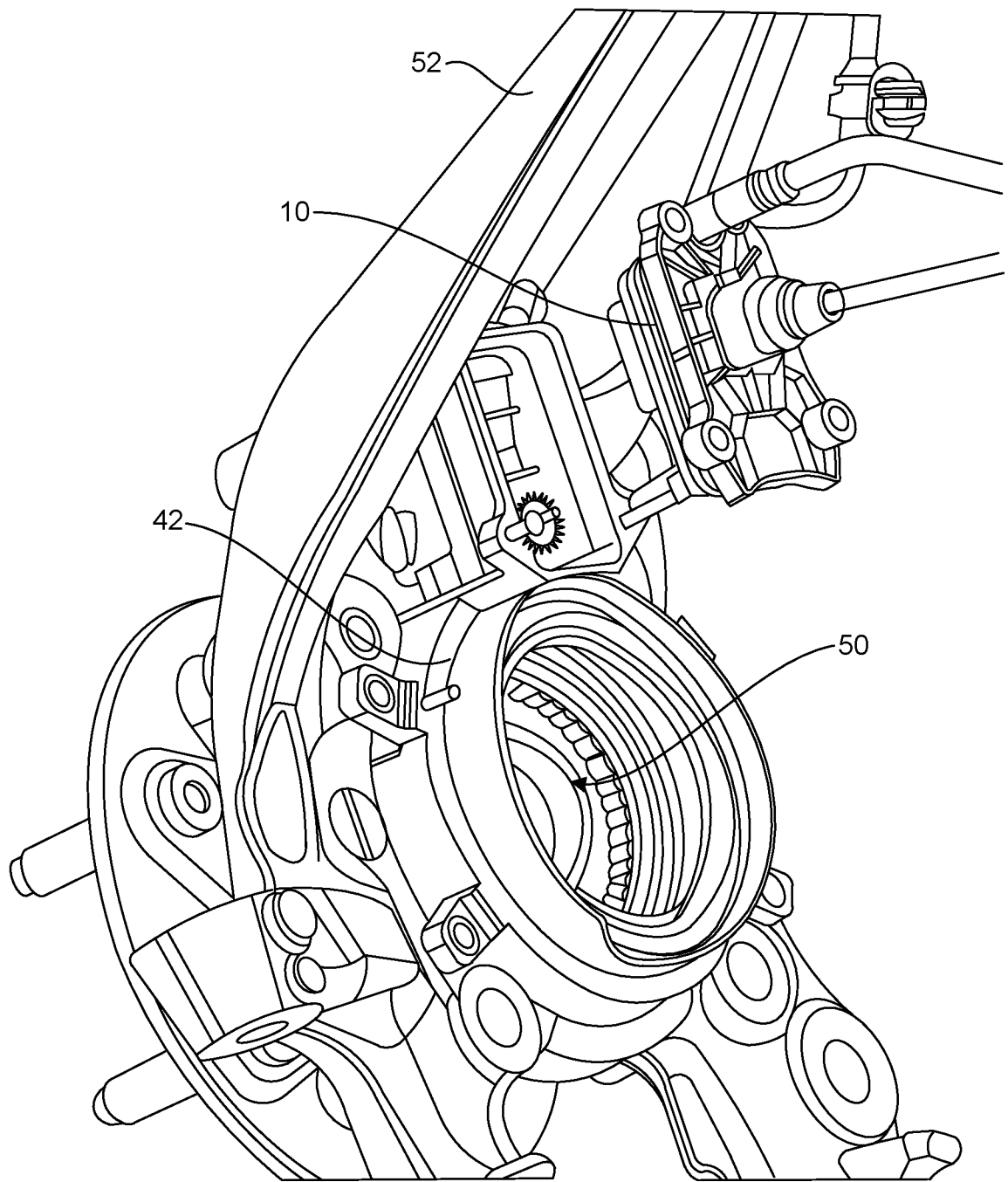
FIG. 6 shows the hub lock harness prior to insertion within the eIWE housing in a knuckle assembly of the vehicle.
Figure 7:
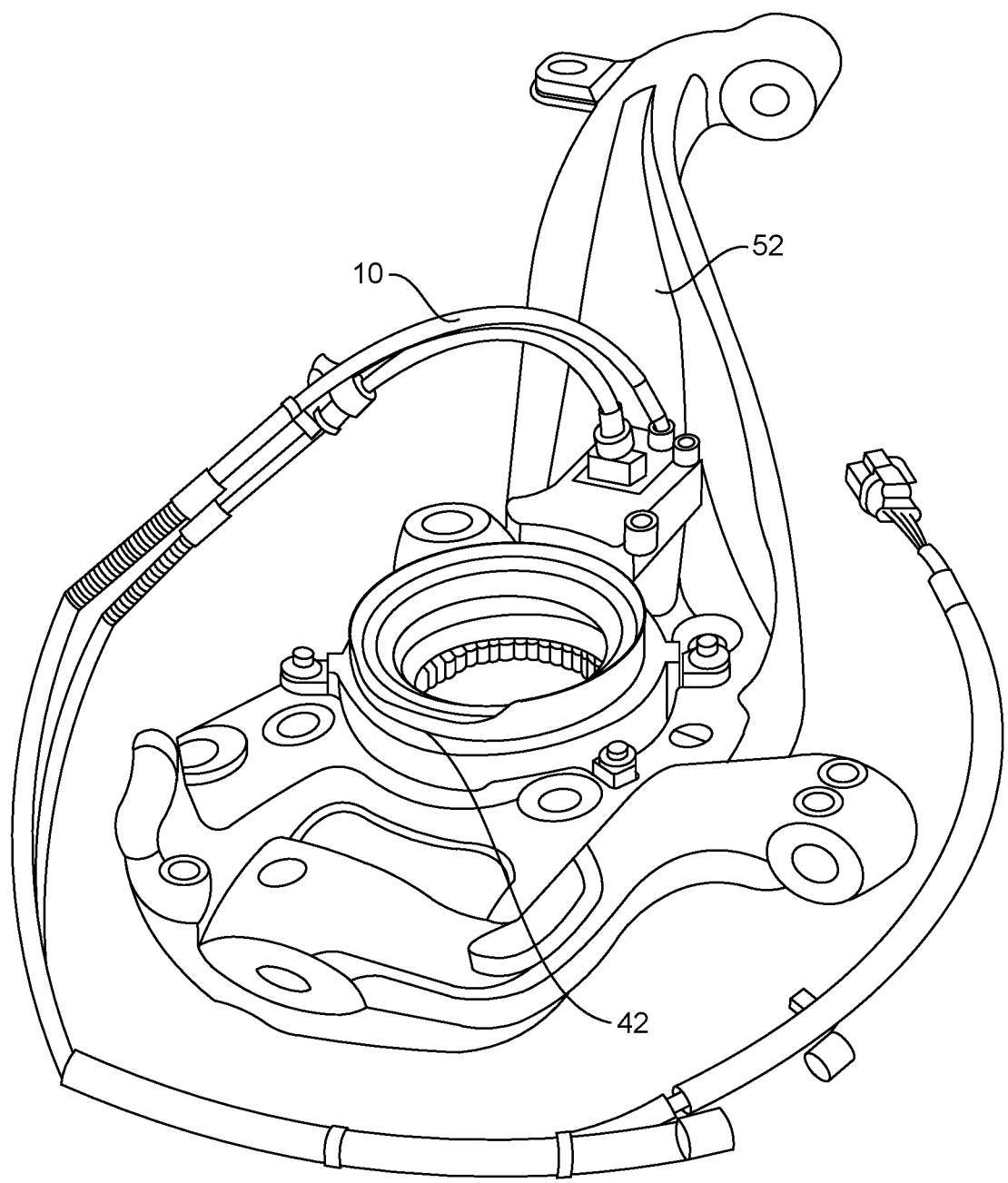
FIG. 7 is another view of the hub lock harness inserted within the eIWE housing in a knuckle assembly of the vehicle.
Figure 8:
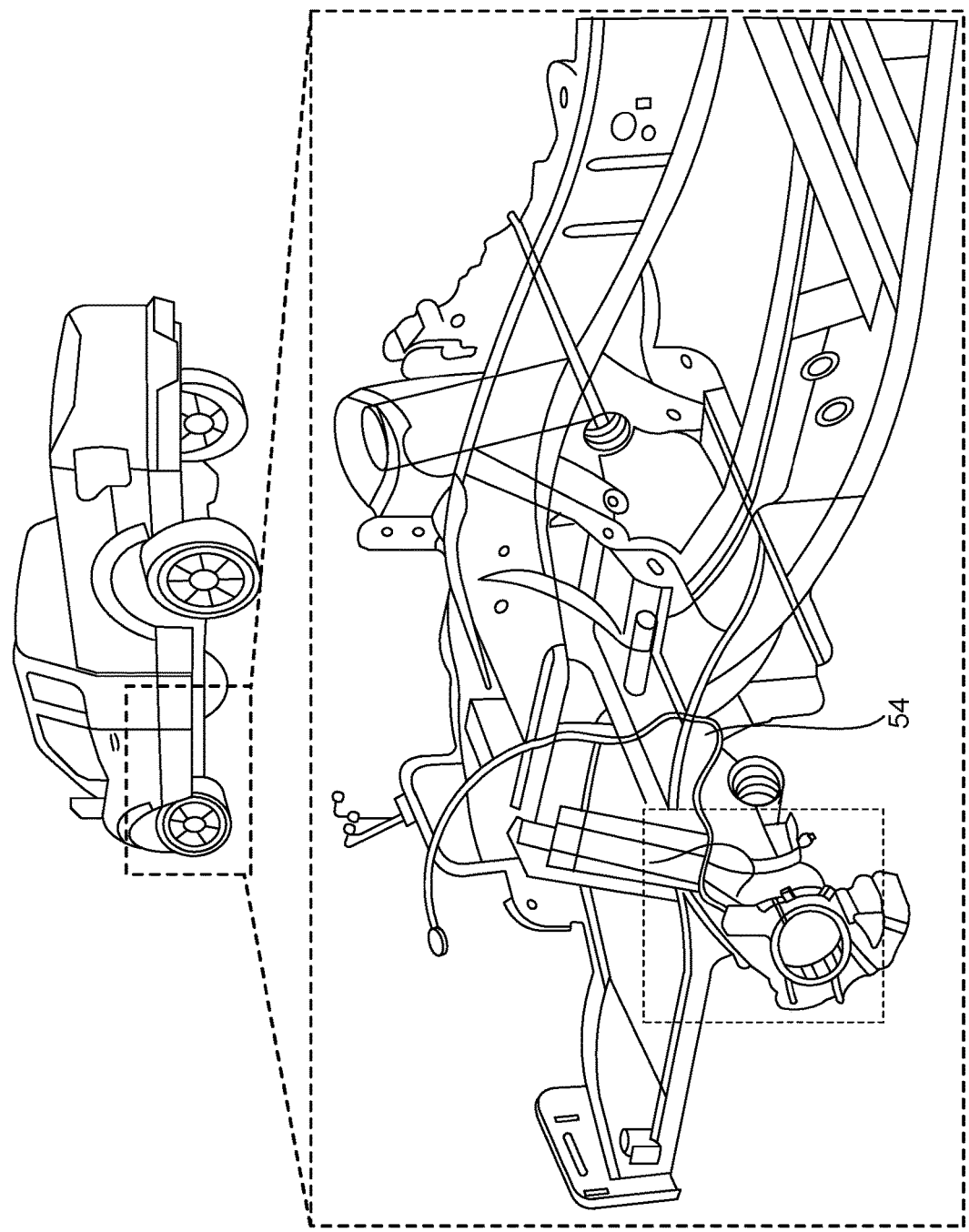
FIG. 8 shows the placement and relative location of the hub lock harness, the eIWE, and knuckle assembly in the vehicle.

Turning now to FIG. 5, hub lock harness assembly 10 can be seen alongside electric Integrated Wheel End disconnect (eIWE) 42, prior to the insertion and electrical connection between harness assembly 10 and eIWE 42 (which is shown, for example, in FIGS. 6-8). As described above, many four-by-four vehicle manufacturers have replaced vacuum IWEs with eIWEs to provide faster shifting speeds and higher durability. An exemplary usage example, illustrating the function of harness assembly 10 and eIWE 42, will now be described.

In one embodiment, electrical power is transmitted through harness assembly 10 to motor 20, which resides in and is secured to motor receptacle 12 via motor retention brackets 24, in the manner described above. Electric motor 20 then converts electrical energy into mechanical energy, which drives worm gear 26 in motor receptacle 12. Worm gear 26 drives a gear train 44 in eIWE 42, which drives a wave gear 46 at the end of the gear train 44. Wave gear 46 translates rotational movement into axial movement of clutch ring 48. Clutch ring 48 moves axially, i.e., back and forth, to disconnect/connect the drive shaft from/to the front wheel hub. Wave gear 46 includes one or more magnets incorporated therein, where the magnets give feedback to magnetic sensor 28, which is supplied electrical current by harness assembly 10, regarding drive train operation status, i.e., whether the vehicle is in two-wheel drive or four-wheel drive. Magnetic sensor 28 converts the magnetic field from the magnets of wave gear 46 into an electrical feedback signal, which is transmitted back to a powertrain control module (PCM). Based on this feedback signal from magnetic sensor 28, the PCM knows the current status of the vehicle, i.e., two-wheel drive or four-wheel drive).

FIG. 6 shows harness assembly 10, particularly, motor receptacle 12, being received by a eIWE housing 41 of eIWE 42. As can be seen, eIWE 42 is secured within the vehicle's knuckle assembly 52.

FIG. 7 is another view of harness assembly 10 inserted in and mechanically connected to eIWE 42, and the combined structure within knuckle assembly 52.

FIG. 8 shows the relative location of harness assembly 10 and eIWE 42 within the vehicle. The combined structure resides in knuckle assembly 52 towards the vehicle's relative front end, i.e. proximate the front wheels.

Figure 9:
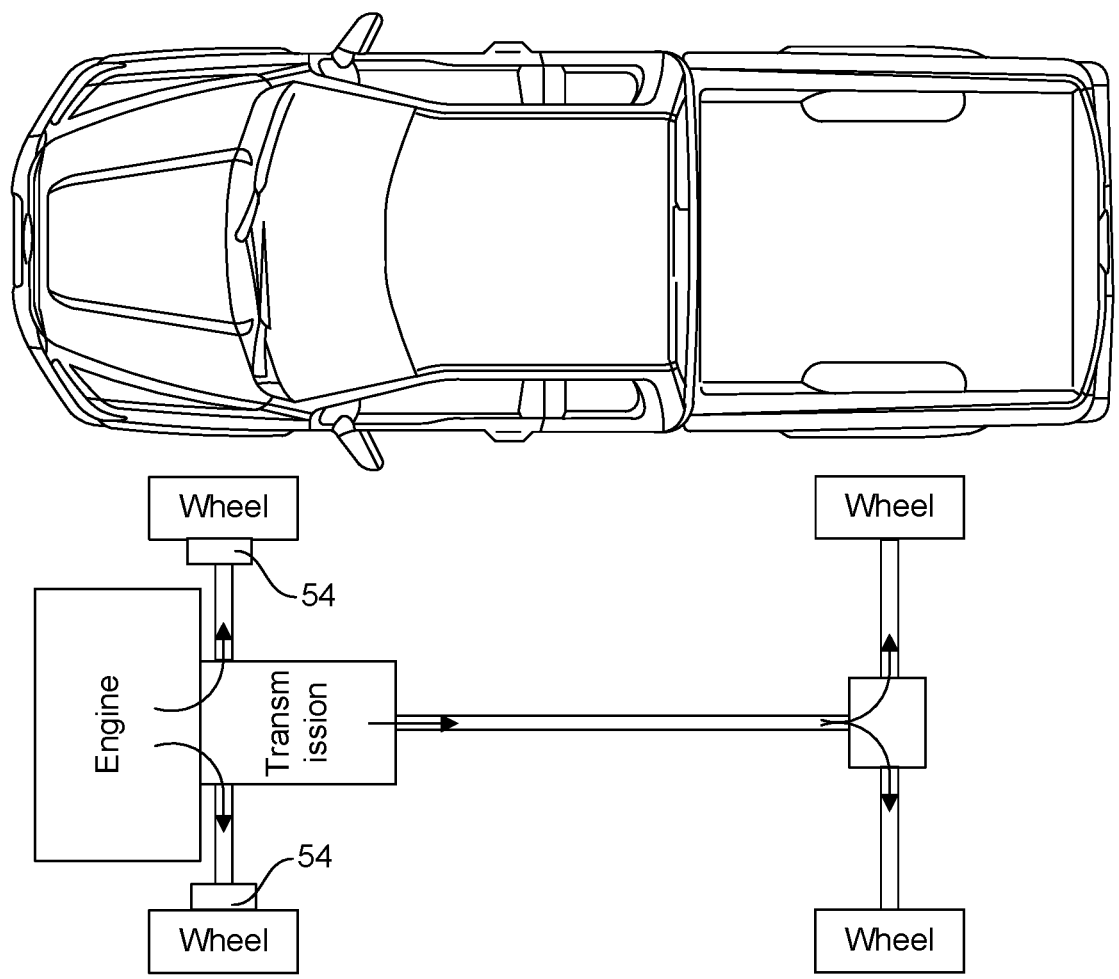
FIG. 9 is another view showing the relative location of the hub lock harness and the eIWE in the vehicle.

FIG. 9 shows the location of eIWE 42, relative to the vehicle's front wheels. In one embodiment, each vehicle will include two eIWEs 42 and two hub lock harness assemblies 10. Each eIWE 42 is mounted to the inboard side of the front knuckle assembly 52 in order to disconnect/connect the drive shafts of the front axle from/to the front wheels. In other embodiments, eIWE 42 could be used for rear axle applications. The eIWEs 42 provide the ability to switch from two-wheel drive to four-wheel drive and vice versa via the activation of a button or switch within the interior cabin of the vehicle.

Figure 10:
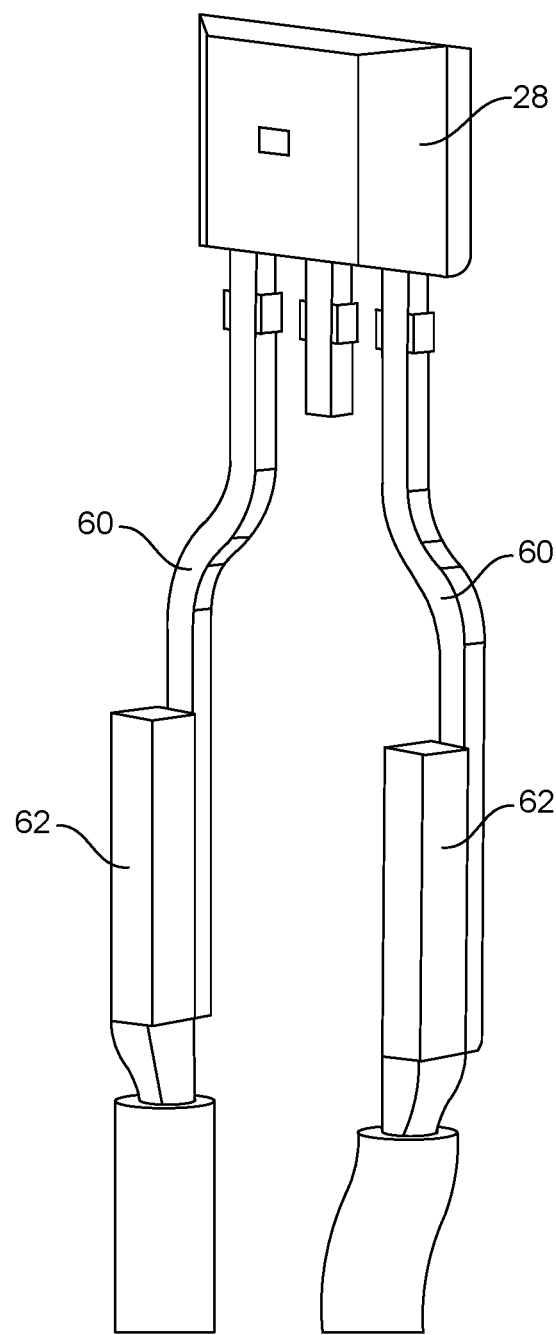
FIG. 10 is a cut-away view of the lead connected to the magnetic sensor and welded wire attached thereto.

FIG. 10 is a cut-away view showing magnetic sensor 28, shown in FIG. 4 and the outer wires connected to magnetic sensor 28. As seen in FIG. 4, a pair of outer wires lead up into the compartment that contains magnetic sensor 28. As seen in the cut-away view of FIG. 10, each of these outer wires contains a magnetic sensor lead 60 connected to magnetic sensor 28. According to an embodiment of the present disclosure, a single wire 62 is directly weld compacted to the magnetic sensor lead 60. This, advantageously, provides a robust, long term connection due to its low contact resistance.

Figure 11:
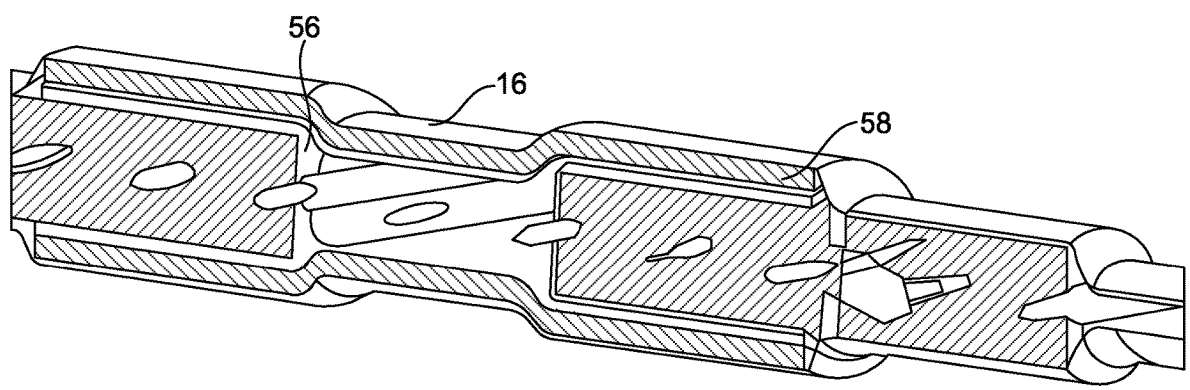
FIG. 11 is a cut-away view of the cable of the hub lock harness of the present disclosure.

FIG. 11 shows a cut-away view of cable 16 of hub lock harness assembly 10 of the present disclosure. Because cable 16 is not air-tight or water-tight (i.e., "media-tight"), the hub lock harness assembly 10 includes adhesive 56 and adhesive line shrink tube 58 within the cable, each of which serves to block the media (e.g., air, water, etc.) through the individual wire strands during the end of line test and vehicle life time.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A four-wheel drive hub lock harness assembly comprising:
    a motor receptacle configured to retain a motor and further configured to be inserted within a housing of an electric Integrated Wheel End (eIWE) disconnect, the motor receptacle comprising:
        a retainer and lead frame assembly configured to house a printed circuit board;
        a magnetic sensor electrically coupled to the retainer and lead frame assembly;
        a first and second bracket extending substantially vertically from the retainer and lead frame assembly, the first and second brackets each including an undercut feature configured to receive corresponding ends of the motor in a snap-fit configuration to secure the motor to the retainer and lead frame assembly;
        encapsulation material embedding the printed circuit board and magnetic sensor for dampening vibrations of the wheels of a vehicle; and
        a first seal situated within the motor receptacle and configured to limit or eliminate water from seeping into the motor receptacle and potentially damaging components therein;
    a housing assembly situated beneath the motor receptacle;
    a cable extending from the housing assembly, the cable configured to electrically connect the hub lock harness assembly to a powertrain control module (PCM); and
    a second seal at least partially surrounding the cable.

2. The four-wheel drive hub lock harness assembly of claim 1, wherein an interior of the cable includes an adhesive material to minimize the amount of media entering the cable.

3. The four-wheel drive hub lock harness assembly of claim 1, wherein the encapsulation material is a hotmelt adhesive.

4. The four-wheel drive hub lock harness assembly of claim 1, wherein the magnetic sensor is a hall-effect integrated circuit.

5. The four-wheel drive hub lock harness assembly of claim 1, wherein the magnetic sensor is electrically coupled to the retainer and lead assembly via an IC lead, and a single wire is directly weld compacted to the IC lead.

* * * * *